(12) United States Patent
Yueh et al.

(10) Patent No.: US 11,682,608 B2
(45) Date of Patent: Jun. 20, 2023

(54) FLEXIBLE ELECTRONIC DEVICE

(71) Applicant: InnoLux Corporation, Miao-Li County (TW)

(72) Inventors: Jui-Jen Yueh, Miao-Li County (TW); Kuan-Feng Lee, Miao-Li County (TW); Yuan-Lin Wu, Miao-Li County (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 17/483,299

(22) Filed: Sep. 23, 2021

(65) Prior Publication Data

US 2022/0013436 A1    Jan. 13, 2022

Related U.S. Application Data

(63) Continuation of application No. 16/879,354, filed on May 20, 2020, now Pat. No. 11,152,285, which is a continuation of application No. 15/995,650, filed on Jun. 1, 2018, now Pat. No. 10,692,799.

(51) Int. Cl.
| | |
|---|---|
| *H01L 23/48* | (2006.01) |
| *H01L 29/423* | (2006.01) |
| *H01L 23/532* | (2006.01) |

(52) U.S. Cl.
CPC ...... *H01L 23/481* (2013.01); *H01L 23/53228* (2013.01); *H01L 29/42372* (2013.01)

(58) Field of Classification Search
CPC ..................................................... H01L 23/481
See application file for complete search history.

(56) References Cited

U.S. PATENT DOCUMENTS

| | | | | |
|---|---|---|---|---|
| 8,598,617 | B2* | 12/2013 | Yu | H01L 24/82 |
| | | | | 257/E33.056 |
| 8,686,428 | B1* | 4/2014 | Sekar | H01L 21/76898 |
| | | | | 257/713 |
| 9,082,824 | B2* | 7/2015 | Reber | H01L 21/76886 |
| 9,136,153 | B2* | 9/2015 | Or-Bach | H01L 29/4236 |
| 9,305,967 | B1* | 4/2016 | A Tharumalingam | ............ |
| | | | | H01L 25/167 |
| 9,385,058 | B1* | 7/2016 | Or-Bach | H01L 23/367 |
| 9,564,416 | B2* | 2/2017 | Hou | H01L 25/50 |
| 9,601,461 | B2* | 3/2017 | Ho | H01L 23/3121 |
| 9,829,710 | B1* | 11/2017 | Newell | G09G 3/3258 |
| 9,871,034 | B1* | 1/2018 | Or-Bach | H01L 27/088 |
| 10,026,671 | B2* | 7/2018 | Yu | H01L 23/36 |
| 10,109,655 | B2* | 10/2018 | Lee | H01L 29/41733 |
| 10,141,259 | B1* | 11/2018 | Nakano | H01L 23/5226 |
| 10,522,393 | B2* | 12/2019 | Kouassi | H01L 21/76224 |

(Continued)

FOREIGN PATENT DOCUMENTS

CN        106973520 A        7/2017

*Primary Examiner* — Caleb E Henry
(74) *Attorney, Agent, or Firm* — Muncy, Geissler, Olds & Lowe, P.C.

(57) ABSTRACT

An electronic device includes: a flexible substrate including a through hole; a connecting element disposed in the through hole; a semiconductor disposed on the flexible substrate; and a first conductive element disposed under the flexible substrate, wherein the first conductive element electrically connects to the semiconductor through the connecting element, wherein a distance between the semiconductor and the connecting element ranges from 5 μm to 500 μm.

12 Claims, 5 Drawing Sheets

(56) References Cited

U.S. PATENT DOCUMENTS

| | | | | |
|---|---|---|---|---|
| 2002/0003232 | A1* | 1/2002 | Ahn | H01L 25/167 257/E25.032 |
| 2003/0017636 | A1* | 1/2003 | Lay | H01L 29/66765 257/E21.414 |
| 2008/0179678 | A1* | 7/2008 | Dyer | H01L 27/1203 438/154 |
| 2010/0225002 | A1* | 9/2010 | Law | H01L 23/481 257/E21.597 |
| 2011/0215354 | A1* | 9/2011 | Wang | H01L 33/58 257/E33.056 |
| 2011/0215360 | A1* | 9/2011 | Wang | H01L 24/17 257/E33.056 |
| 2012/0119228 | A1* | 5/2012 | Hsia | H01L 33/642 257/E33.066 |
| 2012/0313227 | A1* | 12/2012 | Or-Bach | H01L 27/0688 257/659 |
| 2013/0026509 | A1* | 1/2013 | Tohyama | H01L 25/167 257/E33.066 |
| 2014/0061940 | A1* | 3/2014 | Kitao | H01L 21/76898 438/653 |
| 2014/0077391 | A1* | 3/2014 | Kikuchi | H01L 24/97 257/774 |
| 2014/0370706 | A1 | 12/2014 | Yamazaki et al. | |
| 2015/0021081 | A1 | 1/2015 | Mitarai et al. | |
| 2015/0061036 | A1* | 3/2015 | Or-Bach | H01L 27/11206 257/390 |
| 2015/0102477 | A1* | 4/2015 | Qian | H01L 25/105 257/676 |
| 2015/0255434 | A1* | 9/2015 | Yazdani | H01L 23/66 257/737 |
| 2015/0311142 | A1* | 10/2015 | Sekar | H01L 23/481 257/499 |
| 2016/0260752 | A1* | 9/2016 | Shieh | H01L 27/1248 |
| 2016/0307957 | A1* | 10/2016 | A Tharumalingam | G01S 7/481 |
| 2017/0047308 | A1 | 2/2017 | Ho | |
| 2017/0062619 | A1* | 3/2017 | Sasagawa | H01L 27/1207 |
| 2017/0133323 | A1* | 5/2017 | Ho | H01L 23/3675 |
| 2017/0243860 | A1* | 8/2017 | Hong | H01L 24/14 |
| 2017/0358562 | A1* | 12/2017 | Banna | H01L 25/50 |
| 2018/0006058 | A1* | 1/2018 | Lee | H01L 27/1218 |
| 2018/0016471 | A1* | 1/2018 | Kamochi | B32B 37/12 |
| 2020/0279794 | A1 | 9/2020 | Yueh et al. | |

* cited by examiner

FLEXIBLE ELECTRONIC DEVICE

CROSS REFERENCE TO RELATED APPLICATION

This application is a continuation (CA) of U.S. application Ser. No. 16/879,354 filed May 20, 2020, U.S. application Ser. No. 16/879,354 is a continuation of U.S. application Ser. No. 15/995,650 filed Jun. 1, 2018, and the subject matter of which is incorporated herein by reference.

BACKGROUND

1. Field

The present disclosure relates to an electronic device with a narrow border region.

2. Description of Related Art

With the continuous advancement of technologies related to electronic devices, all the electronic devices are now developed toward compactness, thinness, and lightness. For example, thin electronic devices are the mainstream electronic devices on the market. Even though the available electronic devices on the market are compact, thin or light, efforts are still needed. For example, in the electronic devices, the circuit arrangement in the border region still has to be optimized, to achieve the purpose of forming an electronic device with a narrow border region.

Hence, it is desirable to provide an electronic device with a narrow border region to meet the customer's requirement.

SUMMARY

The present disclosure provides an electronic device, which comprises: a flexible substrate including a through hole; a connecting element disposed in the through hole; a semiconductor disposed on the flexible substrate; and a first conductive element disposed under the flexible substrate, wherein the first conductive element electrically connects to the semiconductor through the connecting element, wherein a distance between the semiconductor and the connecting element ranges from 5 µm to 500 µm.

Other novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

Furthermore, when a value is in a range from a first value to a second value, the value can be the first value, the second value, or another value between the first value and the second value.

In addition, the features in different embodiments of the present disclosure can be mixed to form another embodiment.

Embodiment 1

Figure 1:
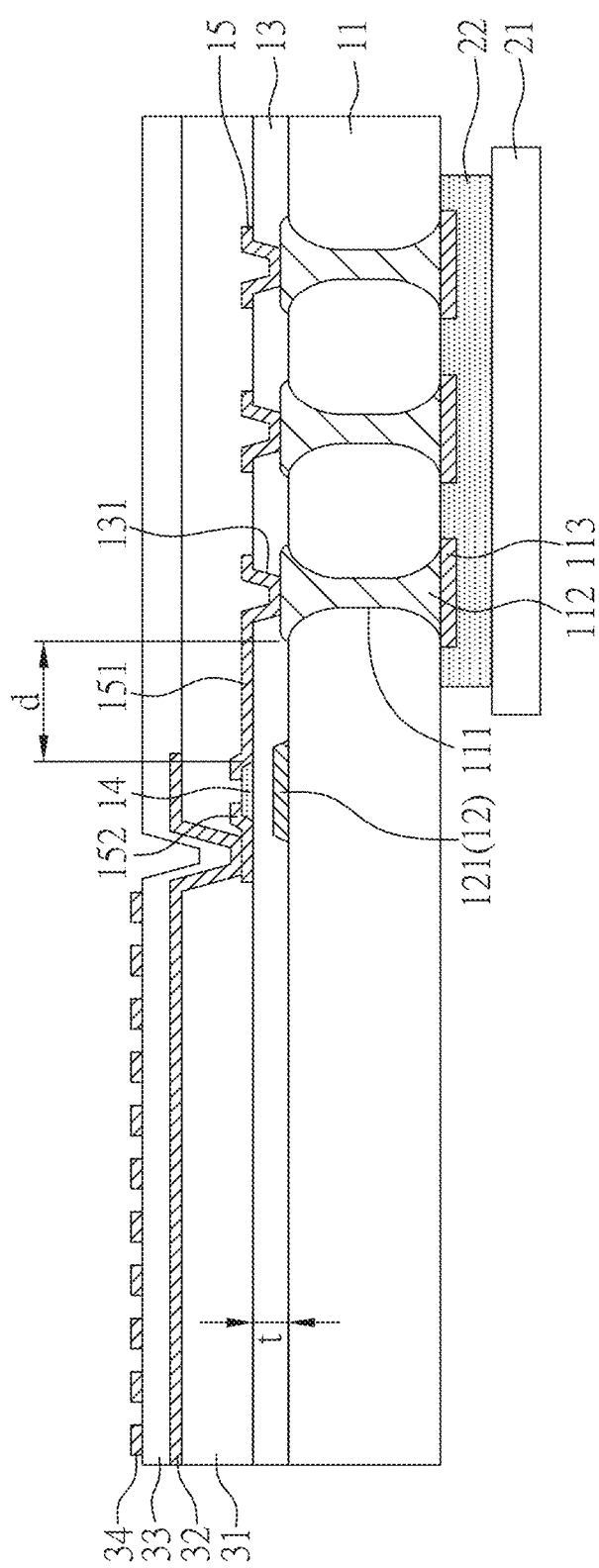
FIG. 1 is a perspective view of an electronic device according to Embodiment 1 of the present disclosure.

FIG. 1 is a perspective view of an electronic device according to the present embodiment.

First, a substrate 11 comprising a first through hole 111 is provided. Herein, one through hole is described for exemplary purpose. The substrate 11 can comprise one or more than one through holes. Herein, the substrate 11 can be a quartz substrate, a glass substrate, a wafer, a sapphire substrate, or etc. The substrate 11 also can be a flexible substrate or a film, and the material of which can comprise polycarbonate (PC), polyimide (PI), polypropylene (PP), polyethylene terephthalate (PET), or other plastic material. When the substrate 11 is a flexible substrate or a film, the present embodiment can provide a flexible electronic device.

Next, a first connecting element 112 is disposed in the first through hole 111, wherein the first connecting element 112 can be prepared through a dispensing process, an injecting process, a printing process, a deposition process, a plating process such as an electroplating process, or any suitable process available in the art. The first connecting element 112 comprises, but is not limited to, Cu, Al, Ti, Mo, Ag, Au, Sn, Zn, a combination thereof, or alloy such as Cu/S alloy.

Then, a first insulating layer 13 is disposed on the substrate 11, followed by forming a semiconductor layer 14 on the first insulating layer 13. Herein, the first insulating layer 13 can comprise silicon oxide, silicon oxynitride, silicon nitride, aluminum oxide, resin, polymer, photoresist, or a combination thereof. In addition, the first insulating layer 13 can have a single layered structure or a multi-layered structure. For example, the first insulating layer 13 can have a single layered structure comprising a silicon nitride layer; or the first insulating layer 13 can have a multi-layered structure comprising one or more silicon nitride layers and one or more silicon oxide layers; but the present disclosure is not limited thereto. The semiconductor layer 14 can comprise, but is not limited to, amorphous silicon, polycrystalline-silicon, or metal oxide such as IGZO (indium gallium zinc oxide), AIZO (aluminum indium zinc oxide), HIZO (hafnium indium gallium zinc oxide), ITZO (indium tin zinc oxide), IGZTO (indium gallium zinc tin oxide), or metal oxide of IGTO (indium gallium tin oxide).

After forming the semiconductor layer 14, a first via 131 is formed in the first insulating layer 13. Herein, one via is described for exemplary purpose. The first insulating layer 13 can comprise one or more than one via. Then, a first conductive layer 15 is formed on the semiconductor layer 14 and the first insulating layer 13, wherein the first conductive layer 15 comprises a first conductive element 151 extending into the first via 131 to electrically connect the first connecting element 112 and the semiconductor layer 14.

After the aforesaid process, the electronic device of the present embodiment is obtained, which comprises: a substrate 11 comprising a first through hole 111; a first connecting element 112 disposed in the first through hole 111; a first insulating layer 13 disposed on the substrate 11 and comprising a first via 131; a semiconductor layer 14 disposed on the first insulating layer 13; and a first conductive layer 15 disposed on the first insulating layer 13, wherein the first conductive layer 15 comprises a first conductive element 151 extending into the first via 131 to electrically connect the first connecting element 112 and the semiconductor layer 14. Herein, the first via 131 overlaps the first connecting element 112 in a normal direction of a surface of the substrate 11. As shown in FIG. 1, the surface is defined as a surface of the substrate 11 on which the above mentioned layers are formed.

The process for forming the semiconductor layer 14 is held at relatively high temperature which is higher than 100 degree Celsius. For example, when the semiconductor layer 14 comprises low temperature polycrystalline-silicon (LTPS) or indium gallium zinc oxide (IGZO), the process for forming the semiconductor layer 14 is around 250-600° C. The relatively high temperature condition for forming the semiconductor layer 14 may cause a risk that metallic element, such as Cu element, in the first connecting element 112 diffuses into the semiconductor layer 14, if the first insulating layer 13 is not formed before performing the process for forming the semiconductor layer 14. In the present embodiment, the first insulating layer 13 as a protection layer is formed before performing the process for forming the semiconductor layer 14, and then the first via 131 in the first insulating layer 13 is formed after the process for forming the semiconductor layer 14 is finished. Because the first connecting element 112 is at least partially covered by the first insulating layer 13 when performing the process for forming the semiconductor layer 14, the metallic element, such as Cu element, in the first connecting element 112 will hardly diffuse into the semiconductor layer 14 even though in the relatively high temperature condition.

Moreover, in the electronic device of the present embodiment, the circuits on the substrate 11 and under the substrate 11 can be electrically connected to each other through the first connecting element 112. Thus, the narrow border or borderless electronic device can be achieved.

In the electronic device of the present embodiment, a concentration of Cu element in the first connecting element 112 is greater than a concentration of Cu element in the first conductive element 151. Because the first conductive element 151 may directly contact to the semiconductor layer 14, the concentration of Cu element in the first conductive element 151 is designed to be lower than that in the first connecting element 112. Thus, the diffusion of the Cu element can be reduced. Herein, the first conductive layer 15 may comprise metal, alloy, metal oxide, metal nitrogen oxide, or other electrode materials. For example, the first conductive layer 15 may have a single-layered structure or a multi-layered structure with sequentially laminated Mo layer, Al layer and Mo layer; but the present disclosure is not limited thereto. The concentration of Cu element can be measured by any equipment available for element analysis such as EDX, TEM, and FIB.

In the electronic device of the present embodiment, a distance d between the semiconductor layer 14 and the first connecting element 112 can be, but not limited to, in a range from 5 μm to 500 μm. If the distance d is set in the above range, the diffusion of the Cu element from the first connecting element 112 into the semiconductor layer 14 may be reduced; resulting in good performance of the semiconductor layer 14, or obtaining a narrow border or borderless electronic device. In addition, a thickness t of the first insulating layer 13 can be, but not limited to, in a range from 600 nm to 1000 nm. If the thickness t is set in the above range, the Cu element in the first connecting element 112 may hardly diffuse into the semiconductor layer 14 because the diffusion is greatly inhibited by the first insulating layer 13 while the time cost for deposition process of the first insulating layer 13 is acceptable.

The electronic device of the present embodiment further comprises: a second conductive layer 12 disposed between the substrate 11 and the semiconductor layer 14, wherein the second conductive layer 12 comprises a gate electrode 121 corresponding to the semiconductor layer 14. The material for the second conductive layer 12 is similar to the material for the first conductive layer 15, and is not repeated again. In addition, the first conductive layer 15 further comprises a drain electrode 152 electrically connecting to the semiconductor layer 14, and the first conductive element 151 of the first conductive layer 15 can be used as a source electrode.

The electronic device of the present embodiment may further comprise a conductive pad 113 disposed under the substrate 11 and electrically connecting to the first connecting element 112. In addition, the electronic device of the present embodiment may further comprise a circuit board 21 disposed under the substrate 11 and electrically connecting to the first connecting element 112, wherein the circuit board 21 electrically connects to the first connecting element 112 through the conductive pad 113 and a conductive film 22 such as an anisotropic conductive film (ACF). However, in other embodiments of the present disclosure, the electronic device may not comprise the conductive pad 113, and the circuit board 21 electrically connects to the first connecting element 112 through the conductive film 22.

In the present embodiment, a roughness of a surface of the first connecting element 112 facing to the circuit board 21 is greater than a roughness of a surface of the first connecting element 112 facing to the first insulating layer 13. The greater roughness of the surface of the first connecting element 112 facing to the circuit board 21 may enhance the adhesion between the conductive film 22 and the first connecting element 112 or the adhesion between the conductive pad 113 and the first connecting element 112. Thus, the electrically connection between the circuit board 21 and the first connecting element 112 can be secured more firmly. In addition, a surface of the first connecting element 112 facing to the first insulating layer 13 is a convex surface in the present embodiment. However, the present disclosure is not limited thereto. In other embodiments of the present disclosure, the surface of the first connecting element 112 facing to the first insulating layer 13 can be a concave surface or a plane surface. Furthermore, a surface of the first connecting element 112 facing to the circuit board 21 can be a plane surface, a concave surface, or a convex surface, while FIG. 1 takes the plane surface as an exemplary purpose.

The electronic device of the present embodiment further comprises: a planer layer 31 disposed on the first conductive layer 15; a first electrode layer 32 disposed on the planer layer 31 and electrically connecting to the drain electrode 152 of the first conductive layer 15; an insulting layer 33 disposed on the first electrode layer 32; and a second electrode layer 34 disposed on the insulting layer 33. Hence, a signal from the circuit board 21 can transmit to the first conductive element 151 of the first conductive layer 15 through the first connecting element 112, and further transmit to the first electrode layer 32.

The material for the planer layer 31 or the insulting layer 33 can be similar to that for the first insulating layer 13, and is not repeated again. The first electrode layer 32 and the second electrode layer 34 may comprise, but is not limited to, transparent conductive oxide, such as ITO, ITZO, IGZO, or AZO.

In addition, in the present embodiment, the drain electrode 152 electrically connects to the first electrode layer 32; but in other embodiments of the present disclosure, the drain electrode 152 electrically connects to the second electrode layer 34.

Furthermore, a display medium (not shown in the figure) is further disposed on the second electrode layer 34, which may comprise a non-self-luminous display medium, such as liquid crystals (LCs), quantum dots (QDs), fluorescence molecules or phosphors. Even though the figure is not shown, the electronic device of the present embodiment may selectively comprise a color filter layer, a black matrix layer, a counter substrate and/or a backlight module.

Embodiment 2

Figure 2:
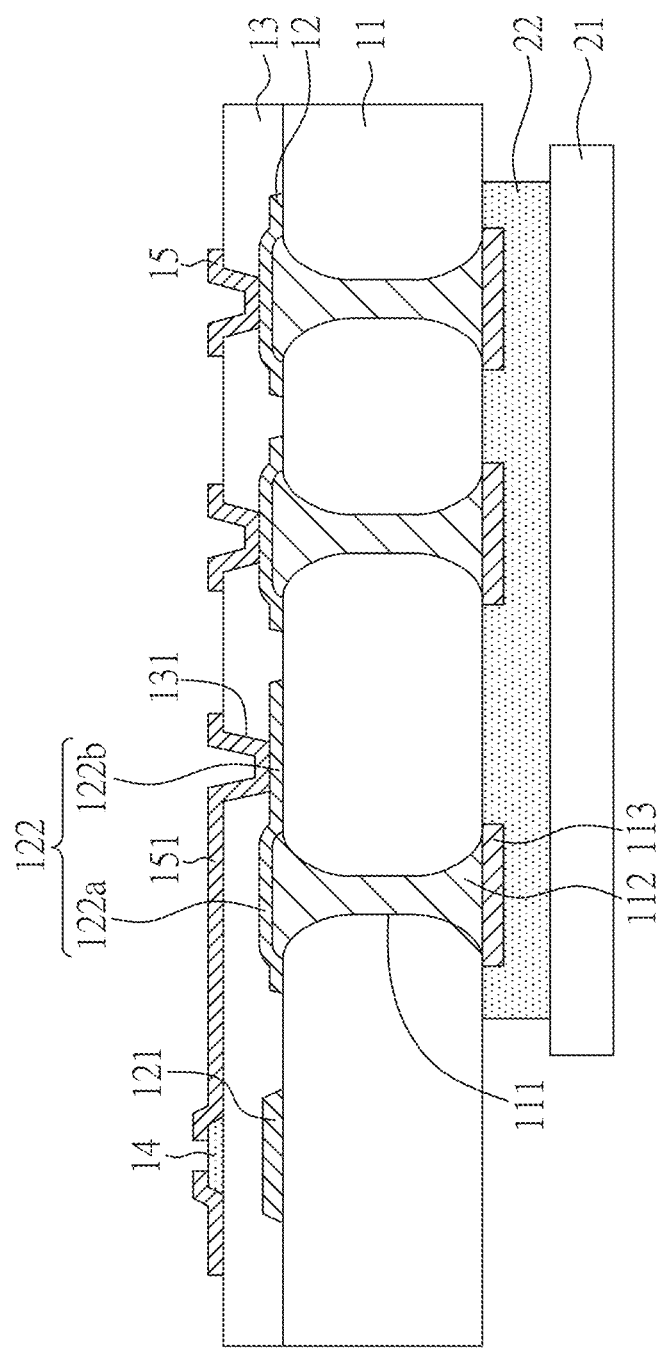
FIG. 2 is a perspective view of an electronic device according to Embodiment 2 of the present disclosure.

FIG. 2 is a perspective view of an electronic device according to the present embodiment, in which only a part of the electronic device different from the electronic device of Embodiment 1 are shown in FIG. 2. The electronic device of the present embodiment is similar to that shown in Embodiment 1, except for the following differences.

In the present embodiment, the electronic device further comprises: a second conductive layer 12 disposed between the substrate 11 and the first insulating layer 13/the semiconductor layer 14, wherein the second conductive layer 12 comprises a second conductive element 122, and the first connecting element 112 electrically connects to the first conductive element 151 through the second conductive element 122. In addition, the second conductive layer 12 further comprises a gate electrode 121 corresponding to the semiconductor layer 14.

In the present embodiment, the material for the second conductive layer 12 can be similar to the material for the first conductive layer 15, and is not repeated again. Hence, a concentration of Cu element in the first connecting element 112 is greater than a concentration of Cu element in the second conductive element 122.

In addition, the second conductive element 122 comprises a first portion 122a and a second portion 122b connecting to the first portion 122a, the first connecting element 112 overlaps the first portion 122a in a normal direction of a surface of the substrate 11, and the first via 131 overlaps the second portion 122b in the normal direction of the surface of the substrate 11. However, in other embodiments of the present disclosure, the second conductive element 122 may not comprise the second portion 122b; in this case, both the first via 131 and the first connecting element 112 overlaps the first portion 122a in a normal direction of the surface of the substrate 11.

In the present embodiment, the second conductive element 122 can act as an intermediate to electrically connect the first connecting element 112 and the first conductive element 151. Thus, the failure rate for electrically connecting the first connecting element 112 and the first conductive element 112 can be reduced. Further, if both the first via 131 and the first connecting element 112 overlap the first portion 122a in a normal direction of the surface of the substrate 11, the border of the electronic device can be narrower.

Embodiment 3

Figure 3:
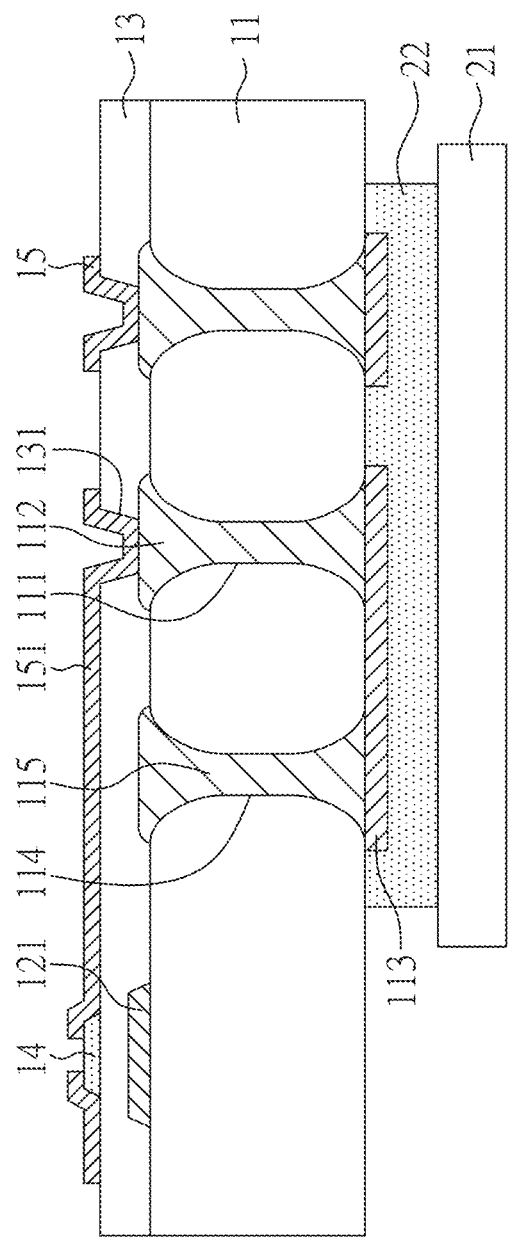
FIG. 3 is a perspective view of an electronic device according to Embodiment 3 of the present disclosure.

FIG. 3 is a perspective view of an electronic device according to the present embodiment, in which only a part of the electronic device different from the electronic device of Embodiment 1 are shown in FIG. 3. The electronic device of the present embodiment is similar to that shown in Embodiment 1, except for the following differences.

In the present embodiment, the substrate 11 further comprises a second through hole 114, and the electronic device further comprises a second connecting element 115 disposed in the second through hole 114, Herein, the second connecting element 115 does not contact the first conductive layer 15. In other word, in a cross-sectional view of the electronic device, the first insulating layer 13 does not comprise a through hole disposed between the second connecting element 115 and the first conductive layer 15.

The electronic device of the present embedment further comprises a conductive pad 113 disposed under the substrate 11 and electrically connecting to the first connecting element 112 and the second connecting element 115. In addition, the electronic device may further comprise a circuit board 21 disposed under the substrate 11 and electrically connecting to the first connecting element 112 and the second connecting element 115, wherein the circuit board 21 electrically connects to the first connecting element 112 and the second connecting element 115 through the conductive pad 113 and a conductive film 22 such as an anisotropic conductive film. However, in other embodiments of the present disclosure, the electronic device may not comprise the conductive pad 113, and the circuit board 21 electrically connects to the first connecting element 112 through the conductive film 22.

In the present embodiment, the first connecting element 112 and the second connecting element 115 electrically connect to each other through the conductive pad 113 or through the circuit board 21. Hence, the second connecting element 115 can be used as a spare connecting element. If the electrical connection between the first conductive element 151 and the first connecting element 112 is not formed as desired, a laser welding can be performed on the first conductive element 151 above the second connecting element 115. Therefore, another first via (not shown in the figure) overlapping the second connecting element 115 in the normal direction of a surface of the substrate 11 can be formed, and the first conductive element 151 can extend into the another first via (not shown in the figure) to electrically connect to the second connecting element 115. Thus, the electrical connection between the first conductive element 151 and the circuit board 21 can be obtained.

Embodiment 4

Figure 4:
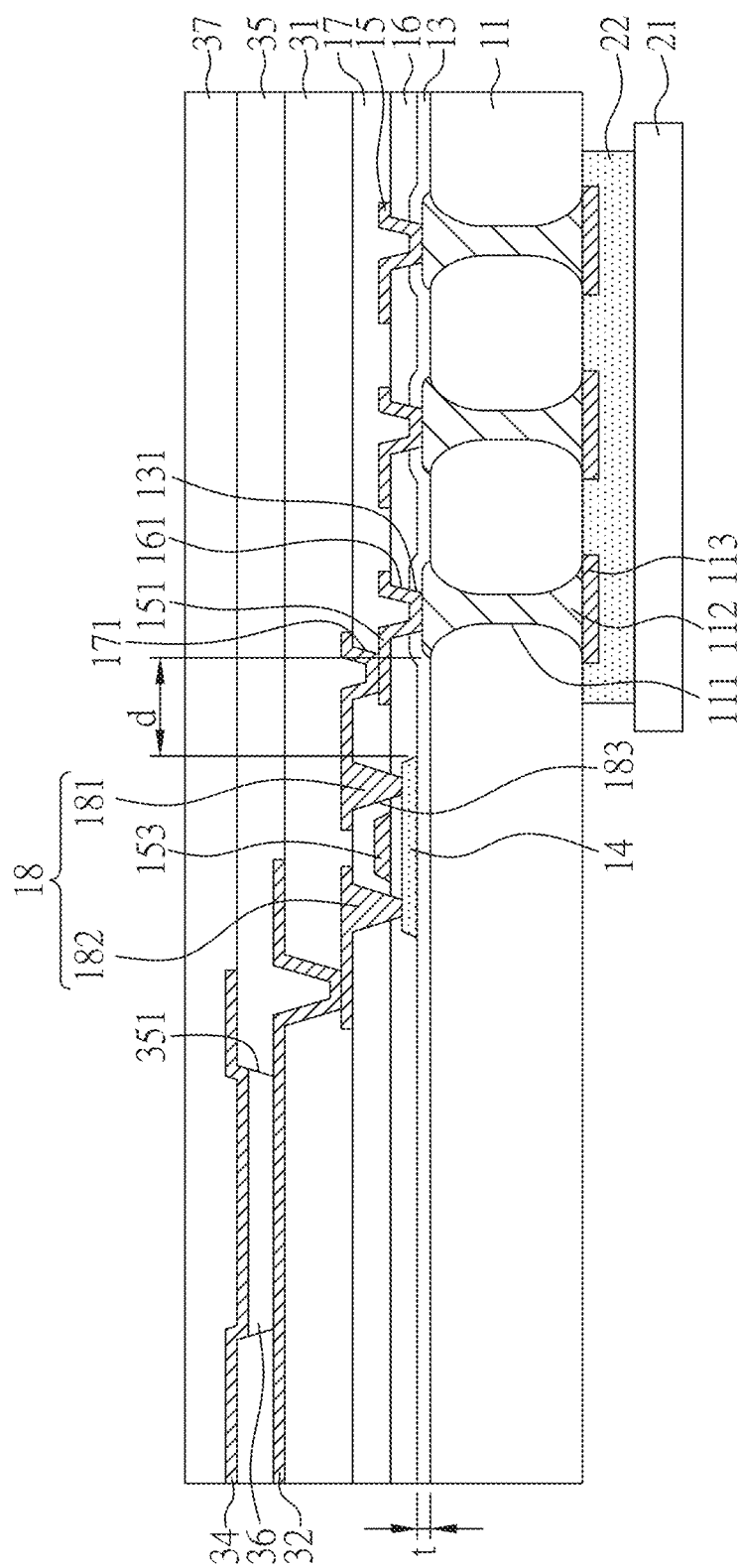
FIG. 4 is a perspective view of an electronic device according to Embodiment 4 of the present disclosure.

FIG. 4 is a perspective view of an electronic device according to the present embodiment. The electronic device of the present embodiment is similar to that shown in Embodiment 1, except for the following differences.

The electronic device of the present embodiment further comprises: a second insulating layer 17 disposed on the first conductive layer 15 and comprising a second via 171; and a third conductive layer 18 disposed on the second insulating layer 17 and comprising a third conductive element 181, wherein the third conductive element 181 extends into the second via 171 to electrically connect to the first conductive element 151. Herein, the third conductive layer 18 further comprises a drain electrode 182 electrically connecting to the semiconductor layer 14, and the third conductive element 181 is used as a source electrode.

The electronic device of the present embodiment further comprises: a third insulating layer 16 disposed on the first insulating layer 13 and between the semiconductor layer 14 and the first conductive layer 15, wherein the third insulating layer 16 comprises a third via 161, and the first conductive element 151 extends into the first via 131 and the third via 161 to electrically connect to the first connecting element 112.

In addition, the first conductive layer 15 further comprises a gate electrode 153 corresponding to the semiconductor layer 14. The third conductive element 181 electrically connects to the semiconductor layer 14 through a fourth via 183 penetrating through the third insulating layer 16 and the second insulating layer 17.

In other embodiments of the present disclosure, the third conductive layer 18 of the electronic device may not comprise the third conductive element 181. In this case, the first conductive layer 15 is disposed on the second insulating layer 17, and the first conductive element 1151 extends into a via penetrating through the first insulating layer 13, the third insulating layer 16 and the second insulating layer 17 and electrically connects to the first connecting element 112.

The material for the third insulating layer 16 or the second insulating layer 17 can be similar to that for the first insulating layer 13, and is not repeated again. Similarly, the material for the third conductive layer 18 can also be similar to that for the first conductive element 151, and is not repeated again. Hence, a concentration of Cu element in the first connecting element 112 is greater than a concentration of Cu element in the third conductive element 18.

In addition, the electronic device of the present embodiment further comprises: a planer layer 31 disposed on the third conductive layer 18; a first electrode layer 32 disposed on the planer layer 31 and electrically connecting to drain electrode 182 of the third conductive layer 18; a pixel defining layer 35 disposed on the first electrode layer 32 and comprising an opening 351; a light emitting layer 36 disposed in the opening 351; a second electrode layer 34 disposed on the pixel defining layer 35 and in the opening 351; and an encapsulating layer 37 disposed on the second electrode layer 34.

Herein, the material for the planer layer 31, the pixel defining layer 35 or the encapsulating layer 37 can be selected from the material for the first insulating layer 13, and is not repeated again. The first electrode layer 32 may comprise a reflective electrode, such as an Ag electrode, an Al electrode or the like. The second electrode layer 34 may comprise, but is not limited to, transparent conductive oxide, such as ITO, WO, ITZO, IGZO, or AZO. In addition, the light emitting layer 36 can comprise any self-luminous display material including an organic or inorganic light emitting material. Therefore, the present embodiment provides an organic light-emitting diode (OLED) display device, an inorganic light-emitting diode (LED) display device, a mini light-emitting diode (mini-LED) display device, a micro light-emitting diode (micro-LED) display device, or a quantum-dot light-emitting diode ((SLED) display device. It could be understood that the chip size of the LED can be 300 μm to 10 mm, the chip size of the mini-LED can be 100 μm to 300 μm, and the chip size of the micro-LED can be 1 μm to 100 μm. But the present disclosure is not limited thereto.

Embodiment 5

Figure 5:
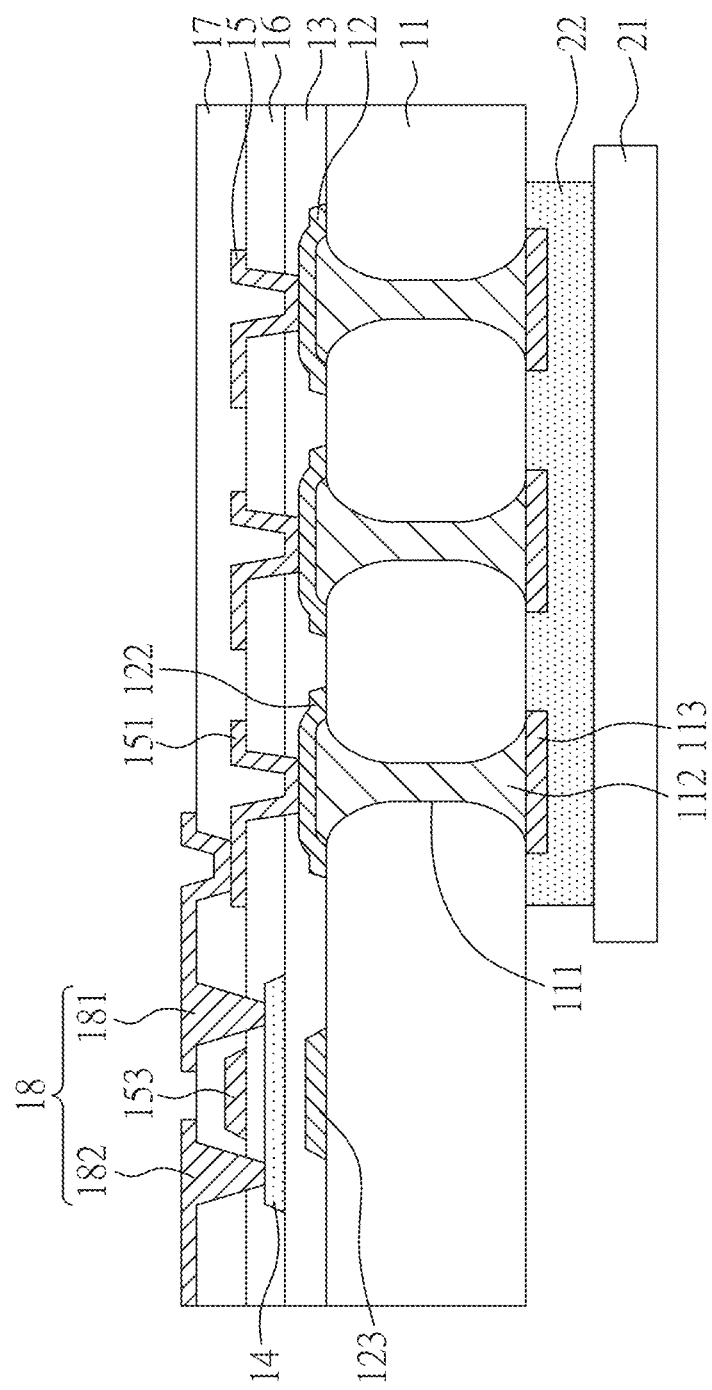
FIG. 5 is a perspective view of an electronic device according to Embodiment 5 of the present disclosure.

FIG. 5 is a perspective view of an electronic device according to the present embodiment, in which only a part of the electronic device different from the electronic device of Embodiment 4 are shown in FIG. 5. The electronic device of the present embodiment is similar to that shown in Embodiment 4, except for the following differences.

In the present embodiment, the electronic device further comprises: a second conductive layer 12 disposed between the substrate 11 and the first insulating layer 13, wherein the second conductive layer 12 comprises a second conductive element 122, and the first connecting element 112 electrically connects to the first conductive element 151 through the second conductive element 122. In addition, the second conductive layer 12 further comprises a light shielding element 123 corresponding to the semiconductor layer 14.

In the present disclosure, at least two electronic devices can be arranged in juxtaposition to form a tiled electronic device. The at least two electronic devices can be the same or different, which can be selected from the electronic device made as described in any of the embodiments of the present disclosure as described previously.

The electronic device made as described in any of the embodiments of the present disclosure can refer to, but is not limited to, a display device, a sensing device, or an antenna device. If the electronic device refers to a sensing device, the drain electrode may electrically connect to a sensing unit. If the electronic device refers to an antenna device, the drain electrode may electrically connect to an antenna unit. The electronic device can be co-used with a touch panel to form a touch electronic device. Meanwhile, an electronic device or touch electronic device may be applied to any display devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. An electronic device, comprising:
a flexible substrate comprising a through hole;
a connecting element disposed in the through hole;
a semiconductor disposed on the flexible substrate; and a first conductive element disposed under the flexible substrate, wherein the first conductive element electrically connects to the semiconductor through the connecting element, wherein, in a direction perpendicular to a normal direction of the flexible substrate, a distance between the semiconductor and the connecting element ranges from 5 µm to 500 µm.

2. The electronic device of claim 1, further comprising a second conductive element, wherein the semiconductor electrically connects to the connecting element through the second conductive element.

3. The electronic device of claim 2, wherein a material of the second conductive element is different from a material of the connecting element.

4. The electronic device of claim 2, further comprising a third conductive element, wherein the semiconductor is electrically connected to the second conductive element through the third conductive element.

5. The electronic device of claim 4, wherein an area which the third conductive element contacts the second conductive element does not overlap the connecting element in the normal direction of the flexible substrate.

6. The electronic device of claim 4, further comprising an insulating layer disposed between the second conductive element and the third conductive element.

7. The electronic device of claim 1, further comprising a gate electrode disposed corresponding to the semiconductor.

8. The electronic device of claim 1, wherein the semiconductor comprises silicon or metal oxide.

9. The electronic device of claim 1, further comprising a chip disposed on the flexible substrate.

10. The electronic device of claim 9, wherein the chip comprises a light emitting diode.

11. The electronic device of claim 1, wherein the connecting element has a surface adjacent to the semiconductor, and the surface is a curved surface.

12. The electronic device of claim 11, wherein the surface is a convex surface.

* * * * *